(12) United States Patent
Kim et al.

(10) Patent No.: US 9,991,203 B2
(45) Date of Patent: Jun. 5, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Rak-Hwan Kim, Suwon-si (KR); Byung-Hee Kim, Seoul (KR); Jin-Nam Kim, Anyang-si (KR); Jong-Min Baek, Seoul (KR); Nae-In Lee, Seoul (KR); Eun-Ji Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/298,855

(22) Filed: Oct. 20, 2016

(65) Prior Publication Data

US 2017/0133317 A1    May 11, 2017

(30) Foreign Application Priority Data

Nov. 5, 2015 (KR) .......................... 10-2015-0155098

(51) Int. Cl.
| | |
|---|---|
| *H01L 29/40* | (2006.01) |
| *H01L 21/44* | (2006.01) |
| *H01L 23/528* | (2006.01) |
| *H01L 21/768* | (2006.01) |
| *H01L 23/532* | (2006.01) |

(52) U.S. Cl.
CPC .... *H01L 23/5283* (2013.01); *H01L 21/76877* (2013.01); *H01L 23/53238* (2013.01)

(58) Field of Classification Search
CPC .................................................. H01L 23/5283
USPC .................. 438/653, 668, 675; 257/751, 775
See application file for complete search history.

(56) References Cited

U.S. PATENT DOCUMENTS

| | | | | |
|---|---|---|---|---|
| 7,545,040 | B2 * | 6/2009 | Ueki | ................. H01L 23/53233 |
| | | | | 257/751 |
| 7,989,956 | B1 | 8/2011 | Zhai et al. | |
| 8,003,527 | B2 * | 8/2011 | Sunayama | .......... H01L 21/2885 |
| | | | | 438/653 |
| 8,324,730 | B2 | 12/2012 | Koike et al. | |
| 8,410,608 | B2 | 4/2013 | Wada et al. | |
| 8,580,688 | B2 | 11/2013 | Koike et al. | |
| 8,772,938 | B2 | 7/2014 | Boyanov et al. | |
| 2014/0183738 | A1 | 7/2014 | Jezewski et al. | |

(Continued)

FOREIGN PATENT DOCUMENTS

| | | |
|---|---|---|
| JP | 4415100 B1 | 2/2010 |
| KR | 101311032 | 9/2013 |

*Primary Examiner* — Calvin Lee

(74) *Attorney, Agent, or Firm* — Harness, Dickey & Pierce, P.L.C.

(57) ABSTRACT

A semiconductor device and a method of fabricating the same are provided. The semiconductor device includes an interlayer insulating film, a first trench having a first width, and a second trench having a second width, the second trench including an upper portion and a lower portion, the second width being greater than the first width, a first wire substantially filling the first trench and including a first metal, and a second wire substantially filling the second trench and including a lower wire and an upper wire, the lower wire substantially filling a lower portion of the second trench and including the first metal, and the upper wire substantially filling an upper portion of the second trench and including a second metal different from the first metal.

20 Claims, 14 Drawing Sheets

(56) References Cited

U.S. PATENT DOCUMENTS

2014/0332963 A1 11/2014 Filippi et al.
2014/0332965 A1 11/2014 Bao et al.

\* cited by examiner

SEMICONDUCTOR DEVICE AND METHOD OF FABRICATING THE SAME

CROSS-REFERENCE TO RELATED APPLICATION

This application claims priority from Korean Patent Application No. 10-2015-0155098 filed on Nov. 5, 2015 in the Korean Intellectual Property Office, and all the benefits accruing therefrom under 35 U.S.C. 119, the contents of which in their entirety are herein incorporated by reference.

BACKGROUND

1. Technical Field

Example embodiments relate to a semiconductor device and/or a method of fabricating the same.

2. Description of the Related Art

A semiconductor device may include transistors having different threshold voltages. An example of such transistors with different threshold voltages may include a combination of a logic transistor and a static random access memory (SRAM) or a dynamic random access memory transistor, and so on.

Research has been conducted for a method of adjusting the threshold voltages of such transistors included in the semiconductor device.

SUMMARY

Some example embodiments relate to a semiconductor device having threshold voltages of a plurality of transistors being adjusted with a simple method.

Some example embodiments relate to a method of fabricating a semiconductor device having threshold voltages of a plurality of transistors being adjusted with a simple method.

Some example embodiments relate to allowing for the threshold voltages of a plurality of transistors to be substantially equal to each other. The method may also allow the method for the threshold voltage of each one of the plurality of transistors to be equal to a desired value.

The example embodiments are not limited to that mentioned above, and other example embodiments that are not mentioned above can be clearly understood to those skilled in the art based on the description provided below.

According to an example embodiment, a semiconductor device includes an interlayer insulating film, a first trench of a first width, formed within the interlayer insulating film, a second trench of a second width, formed within the interlayer insulating film and including an upper portion and a lower portion, wherein the second width of the second trench is wider than the first width, a first wire filling the first trench and including a first metal and a second wire filling the second trench and including a lower wire and an upper wire, wherein the lower wire fills a lower portion of the second trench and includes the first metal, and the upper wire fills an upper portion of the second trench and includes a second metal different from the first metal.

According to another example embodiment, a semiconductor device includes an interlayer insulating film, a first wire formed within the interlayer insulating film, having a first line width, and comprising a first metal, and a second wire being formed within the interlayer insulating film, spaced apart from the first wire, and having a second line width, wherein at least a portion of the second wire includes a second metal that is different from the first metal, wherein the first line width is less than a reference line width, the second line width is greater than the reference line width, and the reference line width is a line width at which line resistances of the first metal and the second metal become equal to each other.

According to an example embodiment, a semiconductor device includes an interlayer insulating film, a first wire formed within the interlayer insulating film, having a first line width, and including a first metal, a second wire formed within the interlayer insulating film, having a second line width that is greater than the first line width, having a height that is the same as the first wire, and including a second metal that is different from the first metal, and a barrier metal formed between the second wire and the interlayer insulating film.

According to an example embodiment, a method of fabricating a semiconductor device includes forming a first trench and a second trench apart from each other within an interlayer insulating film, forming a first wire, wherein the first wire substantially entirely fills the first trench, includes a first metal, and has a first line width smaller than a reference line width and forming a second wire, wherein the second wire substantially entirely fills the second trench, includes a second metal different from the first metal, and has a second line width greater than the reference line width, wherein the reference line width is a line width at which line resistances of the first metal and the second metal become equal.

According to an example embodiment, a method of fabricating a semiconductor device, includes forming an interlayer insulating film, forming a first trench, and a second trench having a wider width than the first trench, wherein depths of the first trench and the second trench are equal, forming a first wire including a first metal in the first trench, forming a second wire including at least a portion of a second metal different from the first metal in the second trench and planarizing upper surfaces of the first wire and the second wire.

In an example embodiment, a semiconductor device includes an interlayer insulating film including a first trench having a first width and a second trench having a second width, the first width and the second width being different, a first wire substantially filling the first trench and including a first metal, and a second wire substantially filling the second trench and including a second metal different from the first metal.

BRIEF DESCRIPTION OF THE DRAWINGS

The above and other objects, features and advantages of the example embodiments will become more apparent to those of ordinary skill in the art by illustrating in detail example embodiments thereof with reference to the accompanying drawings, in which.

DETAILED DESCRIPTION

Figure 1:
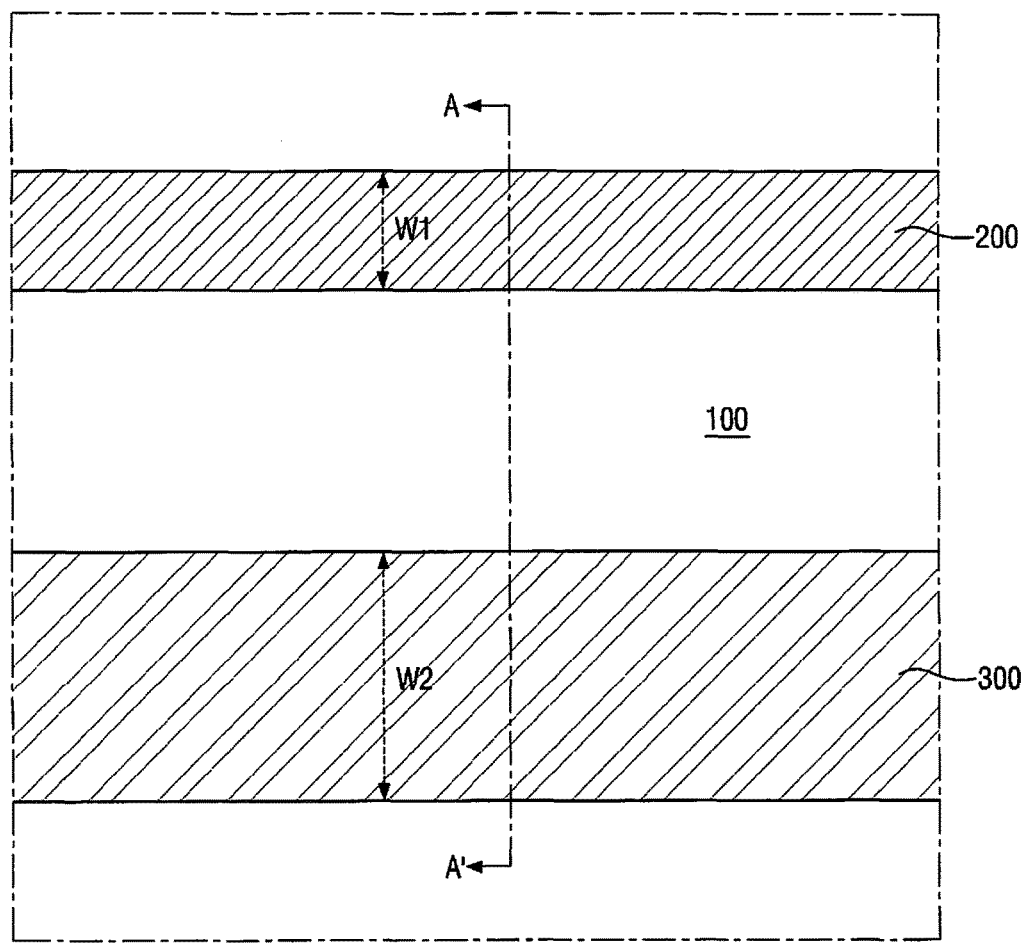
FIG. 1 is a layout diagram illustrating a semiconductor device, according to an example embodiment.

The inventive concepts will now be described more fully hereinafter with reference to the accompanying drawings, in which example embodiments of the invention are shown. This example embodiments may, however, be embodied in different forms and should not be construed as limited to the example embodiments set forth herein. Rather, these example embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "on," "connected to," or "coupled to" another element or layer, it can be directly on, directly connected to or directly coupled to another element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Hereinbelow, a semiconductor device according to an example embodiment will be described with reference to FIGS. 1 to 3.

Figure 2:
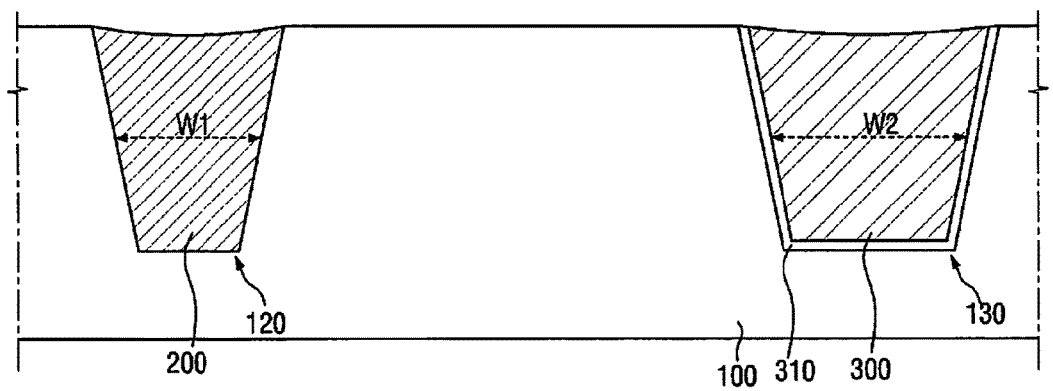
FIG. 2 is a cross sectional view taken on line A-A' of FIG. 1.

FIG. 1 is a layout diagram illustrating a semiconductor device according to an example embodiment, and FIG. 2 is a cross sectional view taken on line A-A' of FIG. 1. FIG. 3 is a graph illustrating a line resistance according to line widths of a first wire and a second wire according to an example embodiment.

Figure 3:
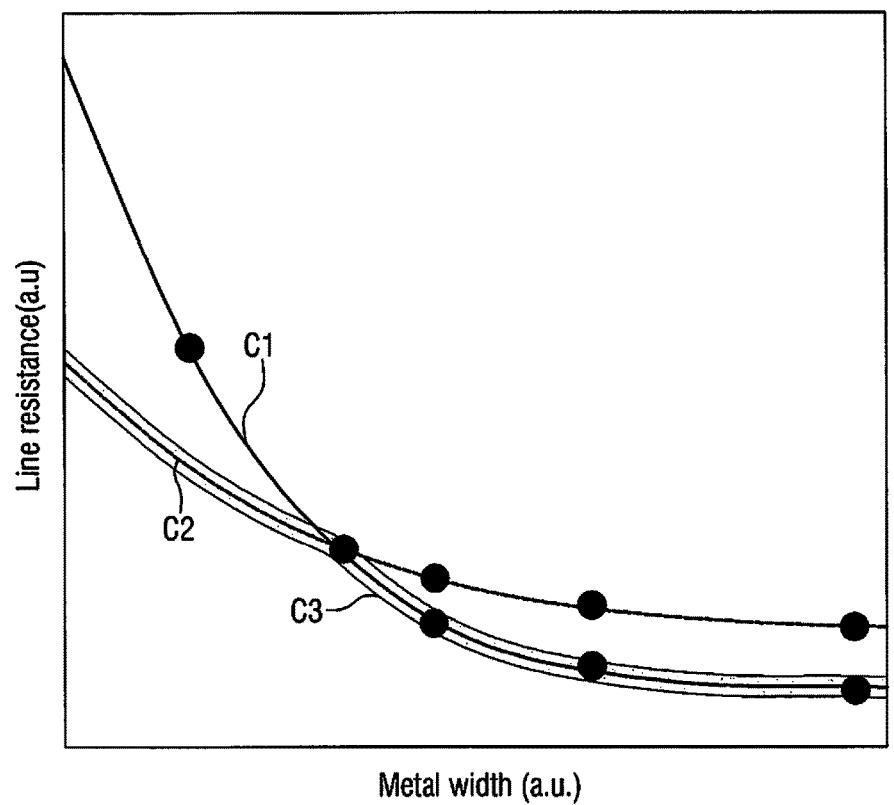
FIG. 3 is a graph illustrating a line resistance according to line widths of a first wire and a second wire, according to an example embodiment.

Referring to FIGS. 1 to 3, a semiconductor device according to an example embodiment includes a first interlayer insulating film 100, a first wire 200, a second wire 300, and a first barrier metal film 310.

The first interlayer insulating film 100 may include an electrical insulating material. That is, the first interlayer insulating film 100 may electrically insulate the first wire 200 and the second wire 300 from each other. The first interlayer insulating film 100 may include at least one of low-k material, oxide film, nitride film or oxynitride film. For example, the low-k material may consist of or include flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof.

The first interlayer insulating film 100 may include a first trench 120 and a second trench 130 therein. The first trench 120 and the second trench 130 may be formed to a same depth within the first interlayer insulating film 100. The term 'same depth' as used herein expresses being formed by a same process and encompasses minute stepped portions.

The width of the first trench 120 may be less than the width of the second trench 130. This is based on the relationships between the line width W1 of the first wire 200 and the line width W2 of the second wire 300, which will be described below. The first trench 120 and the second trench 130 may be spaced from each other within the first interlayer insulating film 100. This is due to the electric insulation between the first wire 200 and the second wire 300, which will be described below.

As illustrated in FIG. 1, the first trench 120 and the second trench 130 may extend in the same direction and positioned abreast, although example embodiments are not limited thereto. The direction in which the first trench 120 and the second trench 130 extend may not be same, as long as the first trench 120 and the second trench 130 are spaced from each other.

The first trench 120 and the second trench 130 may be formed such that the sidewalls thereof are inclined. Such shape may be associated with the characteristics of the trench forming process, i.e., the process of etching the first interlayer insulating film 100. However, example embodiments are not limited to the specific examples provided above. Accordingly, the sidewalls of the first trench 120 and the second trench 130 may have different shapes.

The first wire 200 may be formed in the first trench 120. The first wire 200 may substantially entirely fill the first trench 120. Accordingly, the first wire 200 may extend in the same direction as the direction in which the first trench 120 extends. The first wire 200 may have a first line width W1. In this case, the 'first line width W1' may refer to the line width of a cross section cut substantially vertically to a direction in which the first wire 200 extends.

The upper surface of the first wire 200 may have a 'bowl' shape which is curved by the planarization process. When the planarization process is applied to the first wire 200 and the first interlayer insulating film 100 simultaneously or contemporaneously, due to difference in the etch tolerance of the materials of the first wire 200 and the first interlayer insulating film 100, each of the first wire 200 and the first interlayer insulating film 100 may have different degree of etching. In this case, the first wire 200, having relatively weak etch tolerance, may be etched more than the first interlayer insulating film 100. Due to characteristics of the planarization process, the degree of etching may increase as a distance from an interface between the first wire 200 and the first interlayer insulating film 100 increases. Accordingly, the bowl shape illustrated in FIG. 2 may appear. However, example embodiments are not limited to the example given above.

The first wire 200 may include a conductor. Accordingly, the first wire 200 may be a wire that transmits an electric signal. The first wire 200 may include a first metal. In this case, the first metal may be at least one of, for example, Co, Ru or a Co—Ru solid solution.

However, example embodiments are not limited to the example given above. The 'Co—Ru solid solution' as used herein refers to a state that is different from the alloy state, as this refers to a single crystalline state such as the liquid state, in which atoms of other element are mixed in solid crystal and distributed substantially uniformly. That is, this refers to a metal in which Co and Ru are admixed with each other and distributed substantially uniformly.

The second wire 300 may be formed in the second trench 130. The second wire 300 may substantially entirely fill the second trench 130. The second wire 300 may extend in the same direction as the direction in which the second trench 130 extends. The second wire 300 may have a second line width W2. In this case, the 'second line width W2' may refer to the line width of a cross section cut substantially vertically to a direction in which the second wire 300 extends.

The upper surface of the second wire 300 may have a 'bowl' shape which is curved in by the planarization process. The second wire 300, having relatively weak etch tolerance, may be etched more than the first interlayer insulating film 100. Due to characteristics of the planarization process, the degree of etching may increase as a distance from an interface between the second wire 300 and the first interlayer insulating film 100 increases. Accordingly, the bowl shape as illustrated may appear. However, example embodiments are not limited to the example given above.

The second wire 300 may include a conductor. Accordingly, the second wire 300 may be a wire that transmits an electric signal. The second wire 300 may include a second metal. In this case, the second metal may be Cu, for example. However, example embodiments are not limited to the example given above.

FIG. 3 is a graphical representation of a line resistance according to line widths of Co and Cu. In FIG. 3, C1 is a curve representing the line resistance according to Cu line width, and C2 is a curve representing the line resistance according to the Co line width.

The 'line resistance' as used herein refers to resistance according to unit length in a direction in which the first wire 200 and the second wire 300 extend. Accordingly, total resistance can be given by multiplying the line resistance by the length of the extended wire. That is, the line resistance refers to a value obtained by dividing the total resistance by the length of the wire.

As the width of the wire in the semiconductor device keeps decreasing, exponential increase in the line resistance can take place due to the electron scattering phenomenon from the surface of the Cu wire and grain boundary. As a result, the phenomenon illustrated in FIG. 3 occurs, in which the line resistance of the Co wire decreases more than the line resistance of the Cu wire at or below a certain line width (i.e., reference line width). The 'reference line width' as used herein refers to the line width at which the line resistances of the Cu wire and the Co wire become equal to each other. This is true because Co wire can be relatively freer from the electron scattering phenomenon than Cu wire due to smaller electron mean free path of cobalt (Co). The same applies to a material such as Ru or Co—Ru solid solution.

Meanwhile, when the line width is relatively wider as in the conventional example, due to higher specific resistivity of Co, the Co wire has a relatively greater resistance compared to the Cu wire. Accordingly, based on the reference line width, it is possible to decrease the overall wire resistance by using different materials from each other as the wire forming materials. That is, the second metal such as Cu having low specific resistivity may be used as the wire material when the line width of the wire is greater than the reference line width, while the first metal such as Co having low specific resistivity may be used as the wire material when the line width of the wire is smaller than the reference line width. Accordingly, the wires according to example embodiments can form wires of the lowest resistance according to the respective line widths, and therefore, can enhance the performance of the semiconductor device.

Referring back to FIG. 2, the first barrier metal film 310 may be formed conformally along the bottom surface and the side surface of the second trench 130. The first barrier metal film 310 may be positioned between the second wire 300 and the first interlayer insulating film 100. The first barrier metal film 310 may substantially prevent the material of the second wire 300 from diffusing to the first interlayer insulating film 100. The upper surface of the first barrier metal film 310 may form the same plane as the upper surface of the first interlayer insulating film 100 and the upper surface of the second wire 300.

The first barrier metal film 310 may include a nitride film. For example, the first barrier metal film 310 may include at least one of TaN or MnN. However, example embodiments are not limited to the example given above.

Hereinbelow, a semiconductor device according to another example embodiment will be described with reference to FIG. 4. Elements or operations overlapping with those described above with reference to FIGS. 1 to 3 will be mentioned as briefly as possible or omitted for the sake of brevity.

Figure 4:
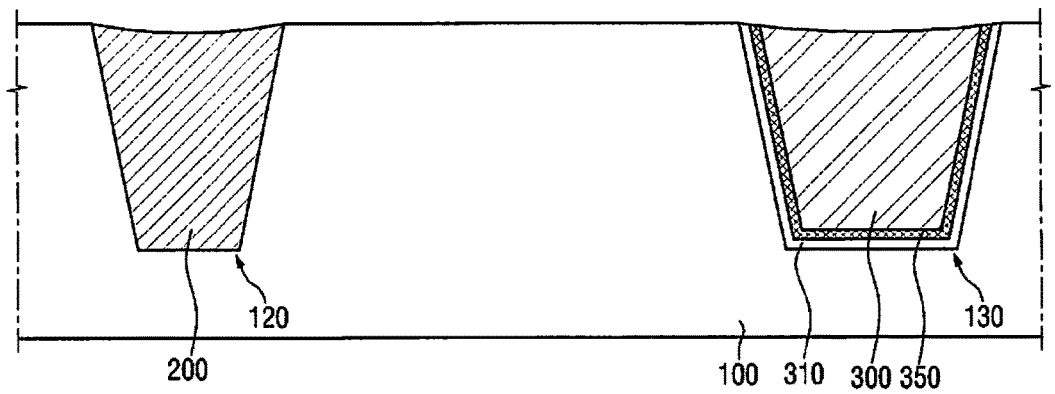
FIG. 4 is a cross sectional view illustrating a semiconductor device, according to another example embodiment.

FIG. 4 is a cross sectional view illustrating a semiconductor device according to another example embodiment.

Referring to FIG. 4, the semiconductor device according to an example embodiment additionally includes a liner metal film 350.

The liner metal film 350 may be formed on the first barrier metal film 310. The liner metal film 350 may be formed conformally along the upper surface of the first barrier metal film 310. The liner metal film 350 may be positioned between the second wire 300 and the first barrier metal film 310. The upper surface of the liner metal film 350 may form the same plane as the upper surface of the first interlayer insulating film 100, the upper surface of the first barrier metal film 310, and the upper surface of the second wire 300.

The liner metal film 350 may include a refractory metal. The liner metal film 350 may include, for example, at least one of Ta, Co or Ru. However, example embodiments are not limited to the example given above.

Hereinbelow, a semiconductor device according to another example embodiment will be described with reference to FIG. 5. Elements or operations overlapping with those described above with reference to FIGS. 1 to 4 will be mentioned as briefly as possible or omitted for the sake of brevity.

Figure 5:
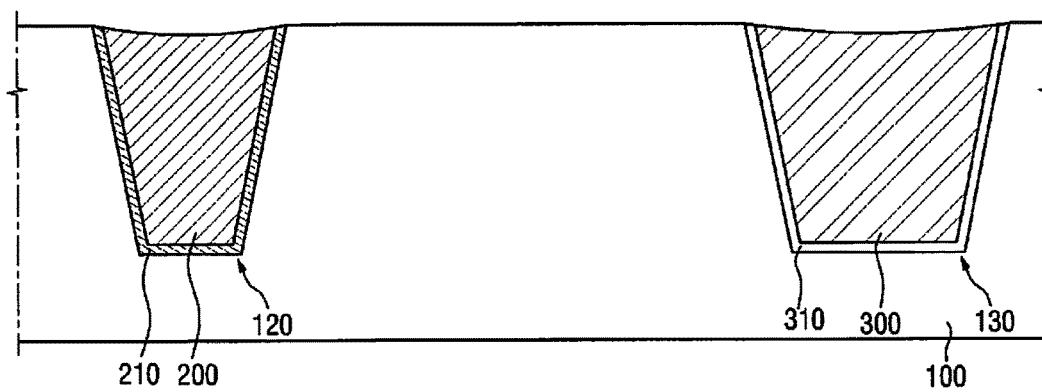
FIG. 5 is a cross sectional view illustrating a semiconductor device according to another example embodiment.

FIG. 5 is a cross sectional view illustrating a semiconductor device according to yet another example embodiment.

Referring to FIG. 5, the semiconductor device according to an example embodiment may additionally include a first adhesion layer 210.

The first adhesion layer 210 may be formed conformally along the bottom surface and the side surface of the first trench 120. The first adhesion layer 210 may be positioned between the first wire 200 and the first interlayer insulating film 100. The first adhesion layer 210 may play a role of attaching the material of the first wire 200 so that the material is fixed without being separated from the first trench 120. Further, the first adhesion layer 210 may play a role of a barrier metal of the first wire 200, i.e., play a role of reducing or substantially preventing diffusion of the first wire 200. The upper surface of the first adhesion layer 210 may form the same plane as the upper surface of the first interlayer insulating film 100 and the upper surface of the first wire 200.

The first adhesion layer 210 may include a nitride film. For example, the first adhesion layer 210 may include TiN. However, example embodiments are not limited to the example given above.

Hereinbelow, a semiconductor device according to another example embodiment will be described with reference to FIG. 6. Elements or operations overlapping with those described above with reference to FIGS. 1 to 5 will be mentioned as briefly as possible or omitted for the sake of brevity.

Figure 6:
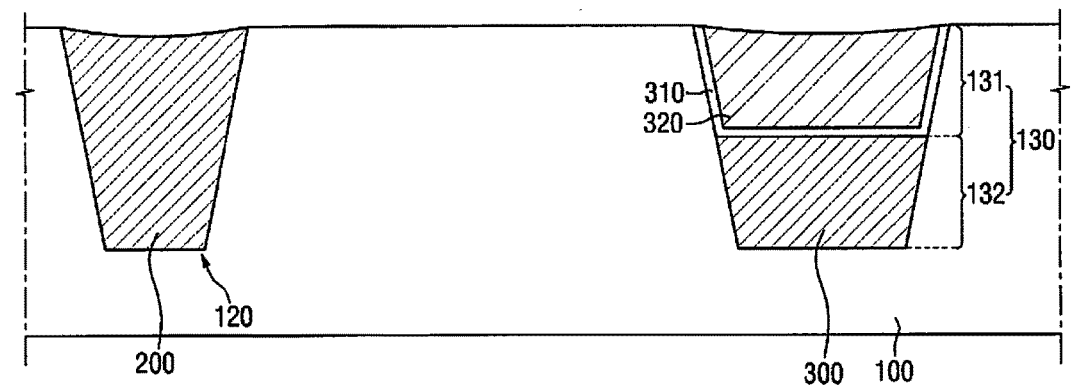
FIG. 6 is a cross sectional view illustrating a semiconductor device according to another example embodiment.

FIG. 6 is a cross sectional view illustrating a semiconductor device according to yet another example embodiment.

Referring to FIG. 6, the second trench 130 according to an example embodiment includes an upper portion 131 and a lower portion 132. Further, the second wire 300 according to an example embodiment includes an upper wire 320 and a lower wire 330.

The upper portion 131 of the second trench 130 may be positioned on the lower portion 132 of the second trench 130. The upper portion 131 and the lower portion 132 of the second trench 130 may be the portions that are connected with each other in one trench. The upper portion 131 of the second trench 130 and the lower portion 132 of the second trench 130 may be formed with the upper wire 320 and the lower wire 330, respectively. The lower portion 132 of the second trench 130 may have a smaller width than the width of the upper portion 131 of the second trench 130. However, example embodiments are not limited to the example given above.

The lower wire 330 may fill the lower portion 132 of the second trench 130. The lower wire 330 may include a first metal. That is, the lower wire 330 may include substantially the same material as the first wire. The lower wire 330 may fill the lower portion 132 of the second trench 130 only, and not fill the upper portion 131.

The first barrier metal film 310 may be formed conformally along the sidewall of the upper portion 131 of the second trench 130 and the upper surface of the lower wire 330. The first barrier metal film 310 may be formed between the first interlayer insulating film 100 and the upper wire 320. Further, the first barrier metal film 310 may be formed between the upper wire 320 and the lower wire 330. That is, the first barrier metal film 310 may be formed so as to extend along the interface of the upper wire 320 and the lower wire 330.

The upper wire 320 may fill the upper portion 131 of the second trench 130. The upper wire 320 may be formed on the lower wire 330. The upper wire 320, along with the lower wire 330 and the first barrier metal film 310, may substantially entirely fill the second trench 130. The upper wire 320 may be formed on the first barrier metal film 310. Accordingly, the first barrier metal film 310 may block direct contact between the upper wire 320 and the lower wire 330.

The upper wire 320 may include a second metal different from the first metal. That is, the upper wire 320 may include a material different from the first wire 200. Regarding the second metal, note that resistance may increase at a wire equaling or exceeding the reference line width, as described above with reference to FIG. 3. Accordingly, in order to decrease the overall resistance of the wire, the second wire 300 equaling or exceeding the reference line width may be partially formed of or include the second metal, while the rest of the second wire 300 is formed of or include the first metal having low resistance.

Hereinbelow, a semiconductor device according to another example embodiment will be described with reference to FIG. 7. Elements or operations overlapping with those described above with reference to FIGS. 1 to 6 will be mentioned as briefly as possible or omitted for the sake of brevity.

Figure 7:
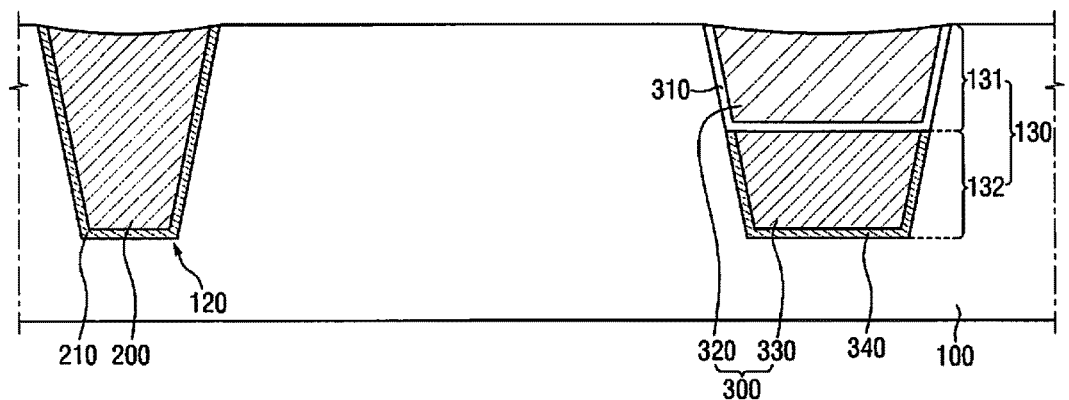
FIG. 7 is a cross sectional view illustrating a semiconductor device according to another example embodiment.

FIG. 7 is a cross sectional view illustrating a semiconductor device according to another example embodiment.

Referring to FIG. 7, according to an example embodiment, a second adhesion layer 340 formed in the lower portion 132 of the second trench 130 may be additionally included.

The second adhesion layer 340 may be formed conformally along the bottom surface and the side surface of the lower portion 132 of the second trench 130. The second adhesion layer 340 may be positioned between the lower wire 330 and the first interlayer insulating film 100. The second adhesion layer 340 may play a role of attaching the material of the lower wire 330 so that the material is fixed without being separated from the lower portion of the second trench 130. Further, the second adhesion layer 340 may play a role of a barrier metal of the lower wire 330, i.e., play a role of reducing or substantially preventing diffusion of the lower wire 330.

The second adhesion layer 340 may be substantially the same material as the first adhesion layer 210. That is, both the first wire 200 and the lower wire 330 may each have the first adhesion layer and the second adhesion layer 340 at lower portions thereof. Alternatively, the second adhesion layer 340 may include a material that is different from the first adhesion layer 210.

Hereinbelow, a semiconductor device according to another example embodiment will be described with reference to FIG. 8. Elements or operations overlapping with those described above with reference to FIGS. 1 to 7 will be mentioned as briefly as possible or omitted for the sake of brevity.

Figure 8:
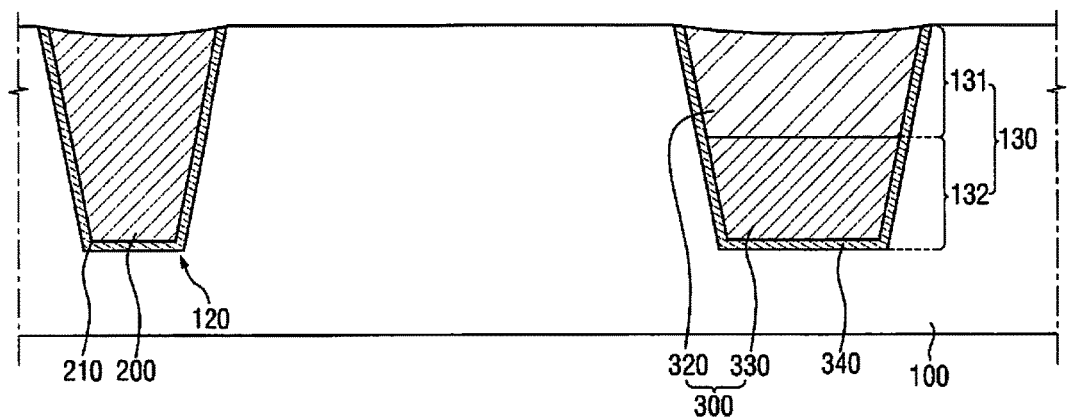
FIG. 8 is a cross sectional view illustrating a semiconductor device according to another example embodiment.

FIG. 8 is a cross sectional view illustrating a semiconductor device according to yet another example embodiment.

Referring to FIG. 8, the second adhesion layer 340 according to an example embodiment is formed along the side surfaces of the lower portion 132 and the upper portion 131 of the second trench 130.

The second adhesion layer 340 may be formed conformally along the bottom surface and the side surface of the lower portion 132 of the second trench 130. Moreover, the second adhesion layer 340 may be formed conformally along the side surface of the upper portion 131 of the second trench 130. That is, the second adhesion layer 340 may be formed conformally along the side surface and the bottom surface of the second trench 130.

The second adhesion layer 340 may directly contact the lower wire 330, and may also directly contact the upper wire 320. That is, it may be the configuration in which the first barrier metal film 310 of FIG. 7 is omitted. Accordingly, the upper wire 320 and the lower wire 330 may directly contact each other.

According to an example embodiment, the process for forming the first barrier metal film 310 separately before forming the upper wire 320, may be omitted. Accordingly, the process is simplified and wires of relatively lower cost can be formed.

Hereinbelow, a semiconductor device according to another example embodiment will be described with reference to FIG. 9. Elements or operations overlapping with those described above with reference to FIGS. 1 to 8 will be mentioned or omitted for the sake of brevity.

Figure 9:
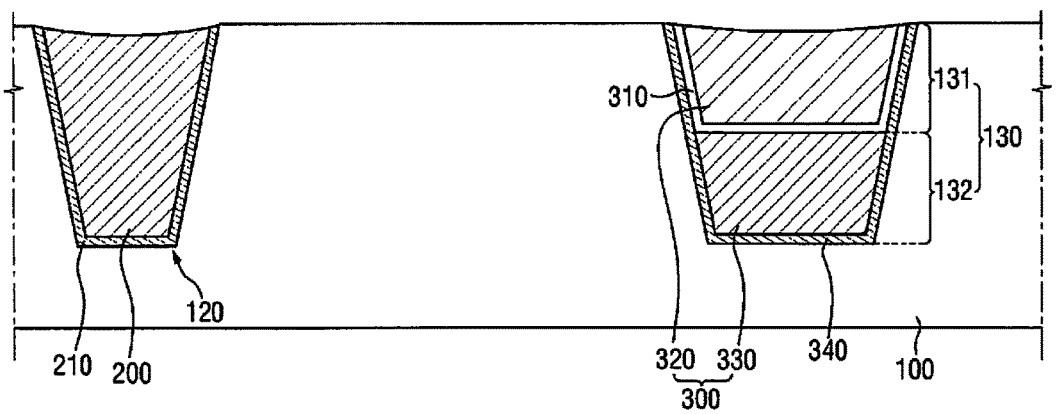
FIG. 9 is a cross sectional view illustrating a semiconductor device according to another example embodiment.

FIG. 9 is a cross sectional view illustrating a semiconductor device according to another example embodiment.

Referring to FIG. 9, the semiconductor device according to an example embodiment additionally includes a first barrier metal film 310.

The first barrier metal film 310 may be formed in the upper portion 131 of the second trench 130. The first barrier metal film 310 may be formed conformally along the side surface of the second adhesion layer 340. The first barrier metal film 310 may be formed conformally along the upper surface of the lower wire 330. Accordingly, the first barrier metal film 310 may be formed between the second adhesion layer 340 and the upper wire 320. The first barrier metal film 310 may also be formed between the upper wire 320 and the lower wire 330. That is, the first barrier metal film 310 may extend along the interface between the upper wire 320 and the lower wire 330.

The semiconductor device according to an example embodiment does not need a process for reducing height of the second adhesion layer 340, and at the same time, can ensure that the diffusion of the upper wire 320 is reduced or substantially prevented by the first barrier metal film 310.

Hereinbelow, a semiconductor device according to another example embodiment will be described with reference to FIG. 10. Elements or operations overlapping with those described above with reference to FIGS. 1 to 9 will be mentioned or omitted for the sake of brevity.

Figure 10:
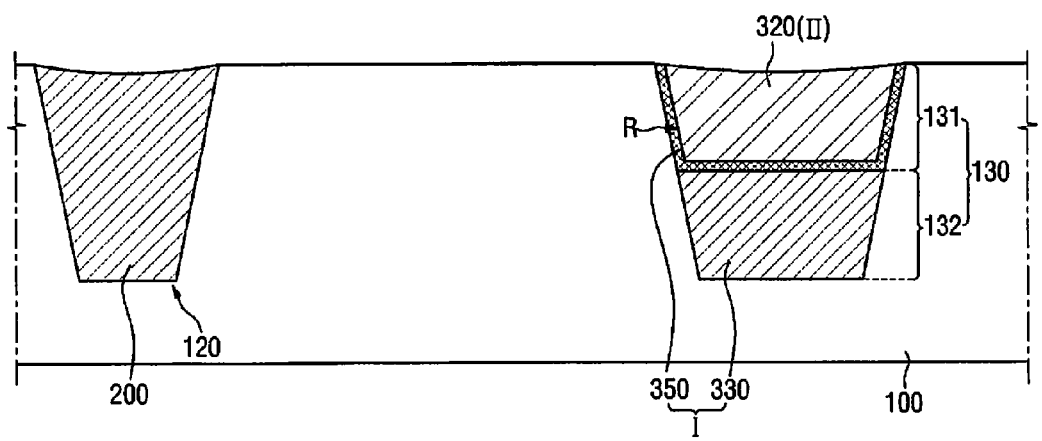
FIG. 10 is a cross sectional view illustrating a semiconductor device according to another example embodiment.

FIG. 10 is a cross sectional view illustrating a semiconductor device according to another example embodiment.

Referring to FIG. 10, a liner metal film 350 is included instead of the first barrier metal film 310 of FIG. 7.

The liner metal film 350 may be formed conformally along the side surface of the upper portion 131 of the second trench 130 and the upper surface of the lower wire 330. The liner metal film 350 may be formed between the upper wire 320 and the first interlayer insulating film 100, and between the upper wire 320 and the lower wire 330.

The liner metal film 350 may include the first metal. For example, the liner metal film 350 may include Co or Ru. In this case, the liner metal film 350 may be a structure integrating therein the liner metal film 350 and the lower wire 330 of a substantially same material. Accordingly, the second wire 300 may include a first region I including therein the lower wire 330 and the liner metal film 350.

A recess R may be formed in the first region I. A sidewall and a bottom surface of the recess R may be formed by the liner metal film 350. The upper wire 320 may be formed in the recess R. The upper wire 320 may substantially entirely fill the recess R. The upper wire 320 may define the second wire 300 as a second region II.

That is, the second wire 300 may include the first region I including the first metal, and the second region II including the second metal. The first region I may include the recess R, and the second region II may substantially fill the recess R.

The semiconductor device according to an example embodiment can be fabricated at low cost, as it is possible to form low-resistance second wire 300 in a simple process.

Hereinbelow, a semiconductor device according to another example embodiment will be described with reference to FIG. 11. Elements or operations overlapping with those described above with reference to FIGS. 1 to 10 will be mentioned or omitted for the sake of brevity.

Figure 11:
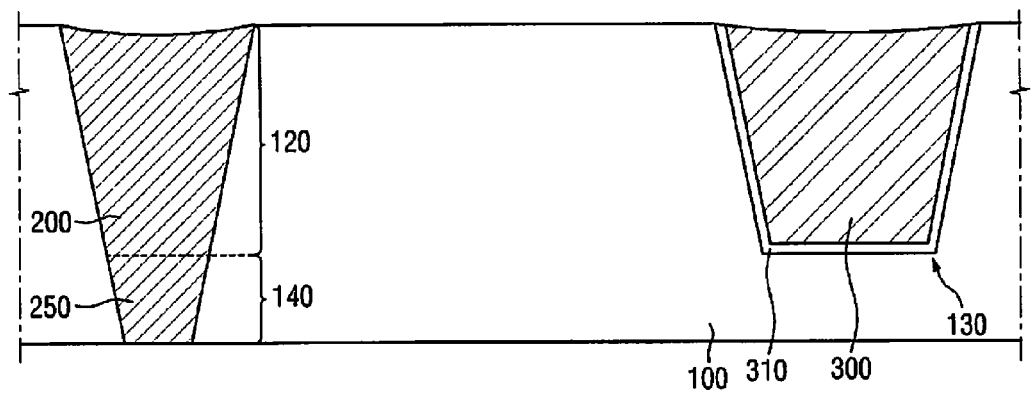
FIG. 11 is a cross sectional view illustrating a semiconductor device according to another example embodiment.

FIG. 11 is a cross sectional view illustrating a semiconductor device according to another example embodiment.

Referring to FIG. 11, a semiconductor device according to an example embodiment includes a first via 140 and a first contact 250.

The first via 140 may be connected with the lower portion of the first trench 120. The first via 140 may pass through the first interlayer insulating film 100. That is, the first via 140, along with the first trench 120, may connect the upper surface and the lower surface of the first interlayer insulating film 100.

The first contact 250 may fill the first via 140. The first contact 250 may be connected with the lower portion of the first wire 200. The first contact 250 may include a conductor. The first contact 250 may include a substantially same material as the first wire 200. The first contact 250 may include, for example, the first metal.

The first contact 250, along with the first wire 200, may electrically connect the lower portion and the upper portion of the first interlayer insulating film 100.

Hereinbelow, a semiconductor device according to another example embodiment will be described with reference to FIG. 12. Elements or operations overlapping with those described above with reference to FIGS. 1 to 11 will be mentioned or omitted for the sake of brevity.

Figure 12:
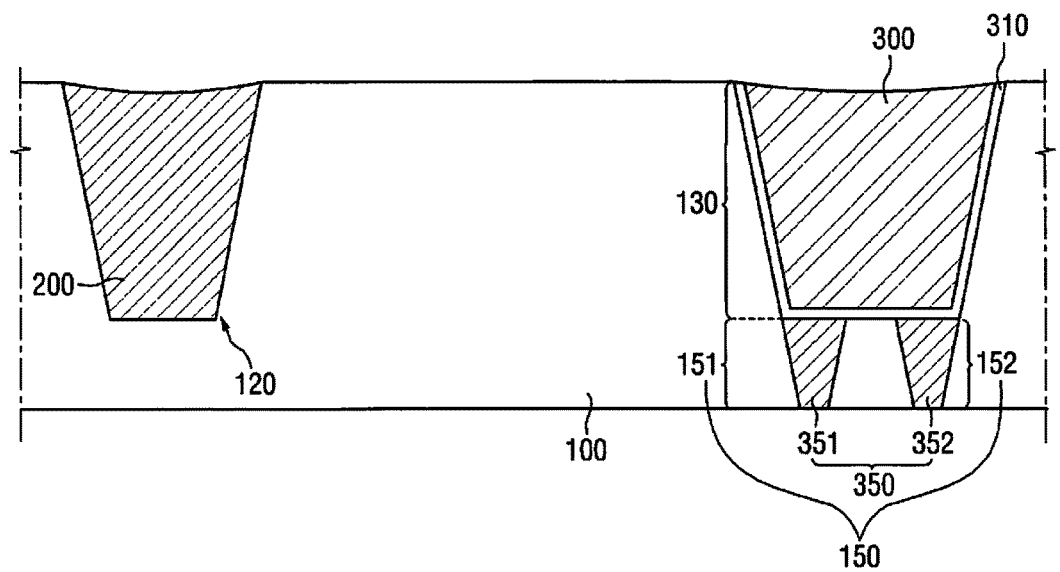
FIG. 12 is a cross sectional view illustrating a semiconductor device according to another example embodiment.

FIG. 12 is a cross sectional view illustrating a semiconductor device according to yet another example embodiment.

Referring to FIG. 12, a semiconductor device according to an example embodiment includes a second via 150 and a second contact 350.

The second via 150 may be connected with the lower portion of the second trench 130. The second via 150 may pass through the first interlayer insulating film 100. That is, the second via 150, along with the second trench 130, may connect the upper surface and the lower surface of the first interlayer insulating film 100.

A plurality of second vias 150 may be provided. The second via 150 may include a first sub-via 151 and a second sub-via 152. While two are illustrated in the drawings, the number of the second vias 150 is not limited herein. The width of the second via 150 may be smaller than the width of the second trench 130. The second via 150 and the second trench 130 may have many-to-one relationship. That is, a plurality of second vias 150 may be formed for a single second trench 130.

The second contact 350 may fill the second via 150. The second contact 350 may be connected with the lower portion of the second wire 300. The second contact 350 may include a conductor. The second contact 350 may include a substantially same material as the second wire 300. The second contact 350 may include, for example, the second metal.

A plurality of second contact 350 may be provided. The second contact 350 may include a first sub-contact 351 and a second sub-contact 352. While two contacts are illustrated in the drawings, the number of second contacts 350 is not limited herein. The width of the second contact 350 may be smaller than the width of the second wire 300. The second contact 350 and the second wire 300 may have many-to-one relationship. That is, a plurality of second contacts 350 may be formed for a single second wire 300.

The second contact 350, along with the second wire 300, may electrically connect the lower portion and the upper portion of the first interlayer insulating film 100.

Hereinbelow, a semiconductor device according to another example embodiment will be described with reference to FIG. 13. Elements or operations overlapping elements or operations described above with reference to FIGS. 1 to 12 will be mentioned or omitted for the sake of brevity.

Figure 13:
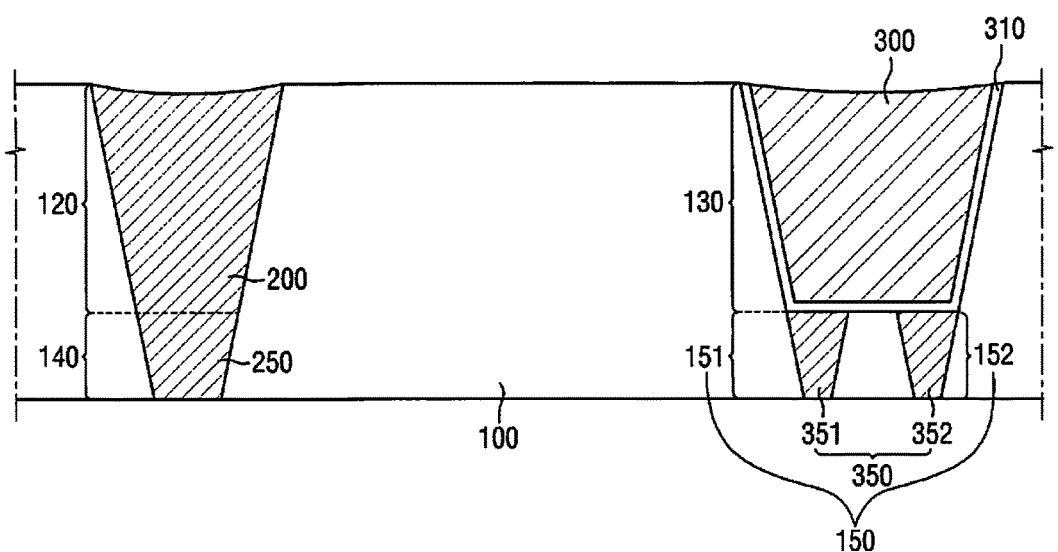
FIG. 13 is a cross sectional view illustrating a semiconductor device according to another example embodiment.

FIG. 13 is a cross sectional view illustrating a semiconductor device according to another example embodiment.

Referring to FIG. 13, a semiconductor device according to an example embodiment includes a first via 140, a second via 150, a first contact 250, and a second contact 350.

The first via 140 may be connected with the lower portion of the first trench 120. The first via 140 may pass through the first interlayer insulating film 100. That is, the first via 140, along with the first trench 120, may connect the upper surface and the lower surface of the first interlayer insulating film 100.

The first contact 250 may fill the first via 140. The first contact 250 may be connected with the lower portion of the first wire 200. The first contact 250 may include a conductor. The first contact 250 may include a substantially same material as the first wire 200. The first contact 250 may include, for example, the first metal.

The first contact 250, along with the first wire 200, may electrically connect the lower portion and the upper portion of the first interlayer insulating film 100.

The second via 150 may be connected with the lower portion of the second trench 130. The second via 150 may pass through the first interlayer insulating film 100. That is, the second via 150, along with the second trench 130, may connect the upper surface and the lower surface of the first interlayer insulating film 100.

A plurality of second vias 150 may be provided. The second via 150 may include a first sub-via 151 and a second sub-via 152. While two second vias are illustrated in the drawings, the number of the second vias 150 is not limited thereto. The width of the second via 150 may be smaller than the width of the second trench 130. The second via 150 and the second trench 130 may have many-to-one relationship. That is, a plurality of second vias 150 may be formed for a single second trench 130.

The second contact 350 may fill the second via 150. The second contact 350 may be connected with the lower portion of the second wire 300. The second contact 350 may include a conductor. The second contact 350 may include a substantially same material as the second wire 300. The second contact 350 may include, for example, the second metal.

A plurality of second contact 350 may be provided. The second contact 350 may include a first sub-contact 351 and a second sub-contact 352. While two second contacts are illustrated in the drawings, the number of the second contacts 350 is not limited herein. The width of the second contact 350 may be smaller than the width of the second wire 300. The second contact 350 and the second wire 300 may have many-to-one relationship. That is, a plurality of second contacts 350 may be formed for one second wire 300.

The second contact 350, along with the second wire 300, may electrically connect the lower portion and the upper portion of the first interlayer insulating film 100.

Hereinbelow, a semiconductor device according to another example embodiment will be described with reference to FIG. 14. Elements or operations overlapping elements or operations described above with reference to FIGS. 1 to 13 will be mentioned or omitted for the sake of brevity.

Figure 14:
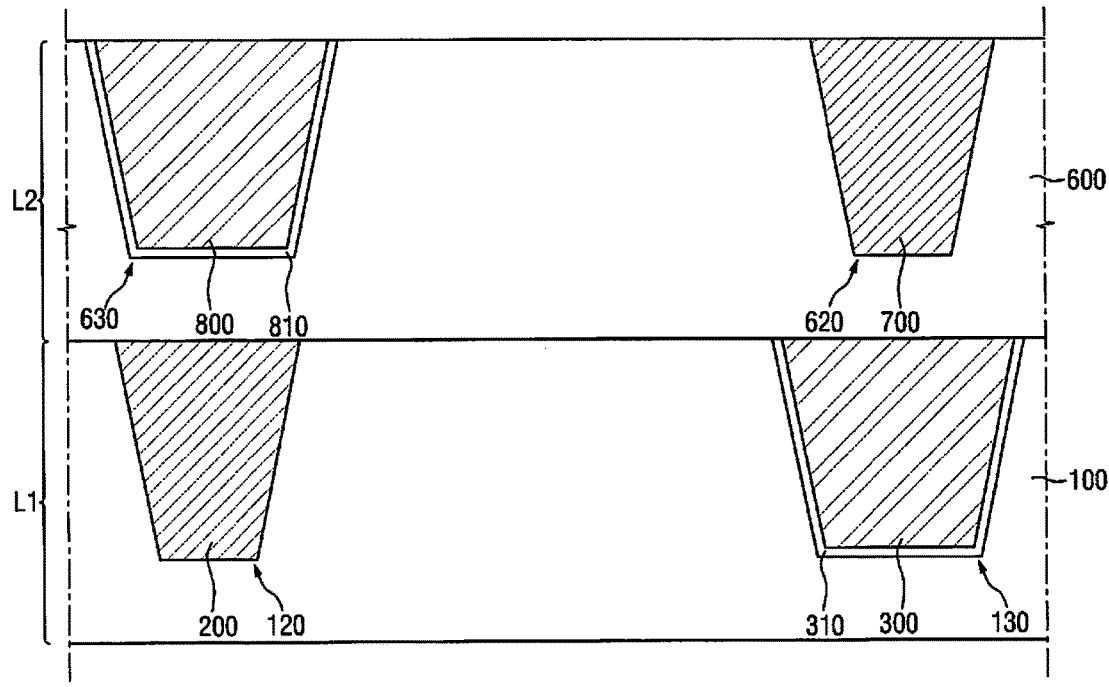
FIG. 14 is a cross sectional view illustrating a semiconductor device according to another example embodiment.

FIG. 14 is a cross sectional view illustrating a semiconductor device according to yet another example embodiment.

Referring to FIG. 14, a semiconductor device according to an example embodiment includes a first level L1 and a second level L2.

The first level L1 may include the first wire 200 and the second wire 300 within the first interlayer insulating film 100 of FIG. 2. The first level L1 will not be described in detail, as this may overlap with the example embodiment described above with reference to FIG. 2.

The second level L2 may be formed on the first level L1. The second level L2 may include a third wire 700 and a fourth wire 800 within a second interlayer insulating film 600.

The second interlayer insulating film 600 may be formed on the first interlayer insulating film 100. The second interlayer insulating film 600 may include an electrical insulating material. That is, the second interlayer insulating film 600 may electrically insulate the third wire 700 and the fourth wire 800 from each other. The second interlayer insulating film 600 may include at least one of low-k material, oxide film, nitride film or oxynitride film. For example, the low-k material may consist of or include flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof. The second interlayer insulating film 600 may include substantially the same material as the first interlayer insulating film 100, or the materials may be different from each other.

The second interlayer insulating film 600 may include a third trench 620 and a fourth trench 630 therein. The third trench 620 and the fourth trench 630 may be formed to a substantially same depth within the second interlayer insulating film 600. The expression 'substantially same depth' as used herein expresses concepts of forming by a substantially same process and encompasses minute stepped portions.

The width of the third trench 620 may be smaller than the width of the fourth trench 630. This is based on the relationships between the line width of the third wire 700 and the line width of the fourth wire 800, which will be described below. The third trench 620 and the fourth trench 630 may be spaced from each other within the second interlayer insulating film 600. This is due to the electric insulation between the third wire 700 and the fourth wire 800, which will be described below.

The third wire 700 may be formed in the third trench 620. The third wire 700 may substantially entirely fill the third trench 620. The third wire 700 may have a third line width. In this case, the 'third line width' may refer to the line width of a cross section cut substantially vertically to a direction in which the third wire 700 extends. The third wire 700 may include a conductor. Accordingly, the third wire 700 may be a wire that transmits an electric signal. The third wire 700 may include a first metal.

The fourth wire 800 may be formed in the fourth trench 630. The fourth wire 800 may substantially entirely fill the fourth trench 630. The fourth wire 800 may have a fourth line width. In this case, the 'fourth line width' may refer to the line width of a cross section cut substantially vertically to a direction in which the fourth wire 800 extends. The fourth wire 800 may include a conductor. Accordingly, the fourth wire 800 may be a wire that transmits an electric signal. The fourth wire 800 may include a second metal.

A second barrier metal film 810 may be formed conformally along the bottom surface and the side surface of the fourth trench 630. The second barrier metal film 810 may be positioned between the fourth wire 800 and the second interlayer insulating film 600. The second barrier metal film 810 may substantially inhibit or prevent the material of the fourth wire 800 from diffusing to the second interlayer insulating film 600. The upper surface of the second barrier metal film 810 may form a substantially same plane as the upper surface of the second interlayer insulating film 600 and the upper surface of the fourth wire 800.

That is, the wires formed of or including the first metal and the second metal may be determined at respective levels according to line widths. Accordingly, the semiconductor device according to an example embodiment may have low-resistance interconnect structure.

Hereinbelow, a method of fabricating a semiconductor device according to an example embodiment will be explained with reference to FIGS. 15 and 20. Elements or operations overlapping with those described above with reference to the semiconductor device of FIGS. 1 to 14 will be mentioned as briefly as possible or omitted for the sake of brevity.

FIGS. 15 to 20 are views illustrating intermediate stages of fabrication, illustrating a method of fabricating a semiconductor device according to an example embodiment.

Figure 15:
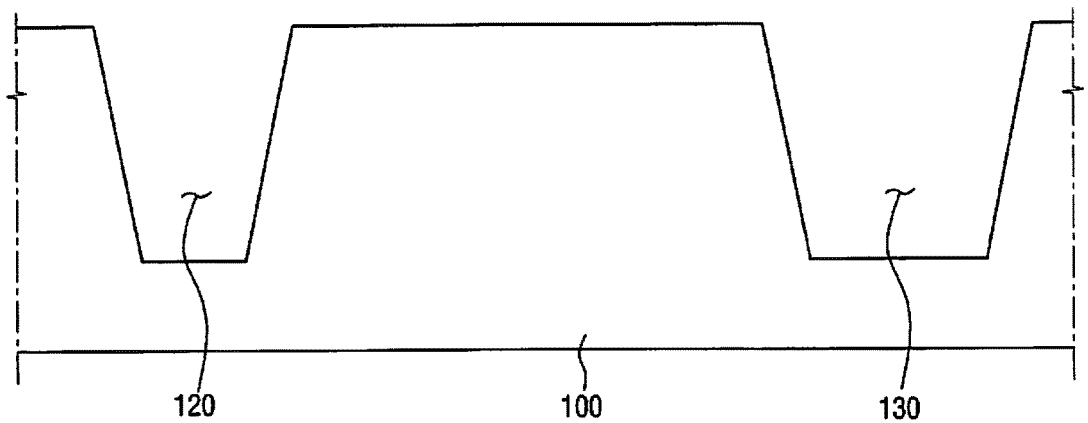
FIGS. 15 to 20 are views illustrating intermediate stages of fabrication and illustrating a method of fabricating a semiconductor device, according to an example embodiment.

Referring to FIG. 15, the first interlayer insulating film 100 is formed, and the first trench 120 and the second trench 130 are formed.

The first trench 120 and the second trench 130 may be formed by etching the first interlayer insulating film 100. The first trench 120 and the second trench 130 may be formed to a substantially same depth. The width of the first trench 120 may be smaller than the width of the second trench 130. The width of the first trench 120 may be smaller than the reference line width described above with reference to FIG. 3. The width of the second trench 130 may be greater than the reference line width.

Figure 16:
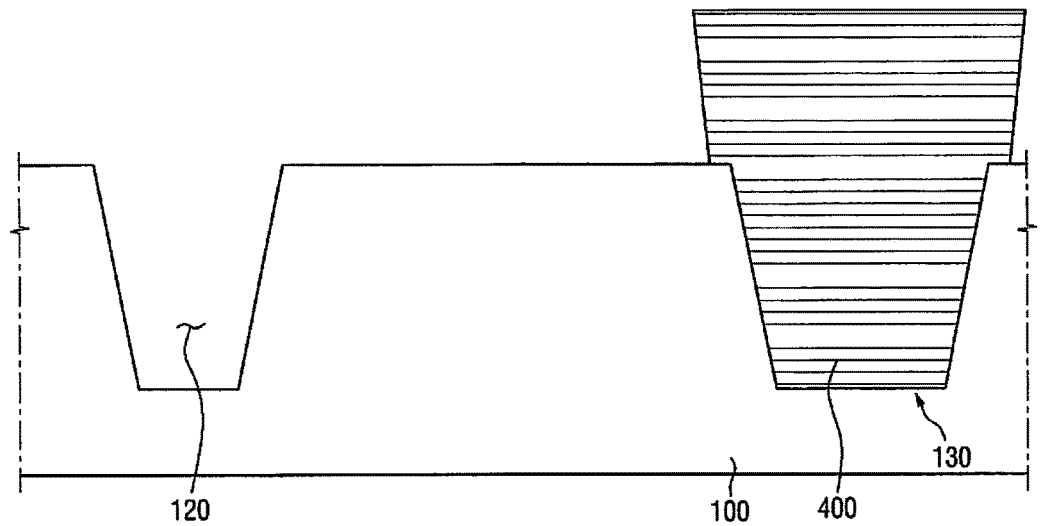

Next, referring to FIG. 16, a filler 400 is filled in the second trench 130.

The filler 400 may substantially entirely fill the second trench 130. However, the filler 400 may expose the first trench 120. That is, the filler 400 may be formed in the second trench 130 temporarily so that the first wire 200 fills the first trench 120, rather than the second trench 130 in a subsequent stage. The filler 400 may be so formed as to fill and exceed the second trench 130.

Figure 17:
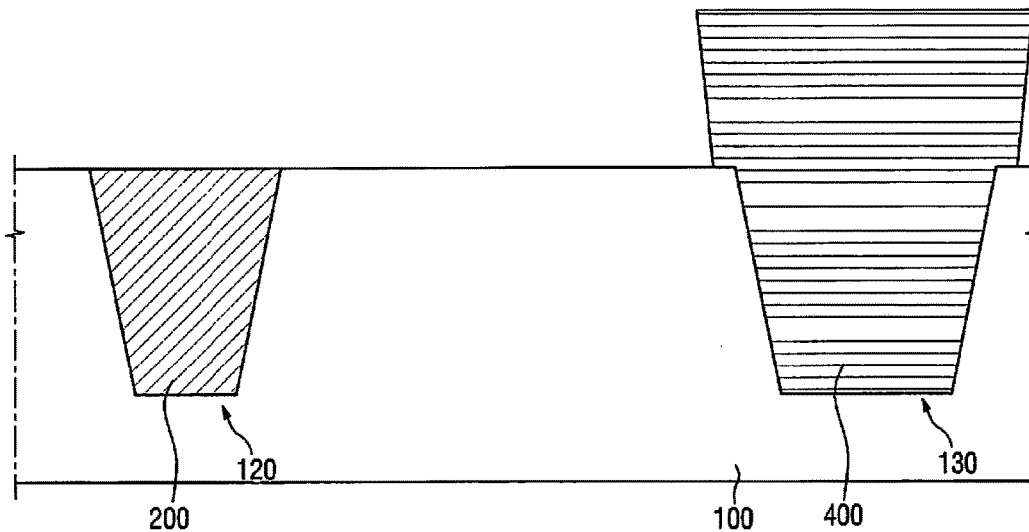

Next, referring to FIG. 17, the first wire 200 is formed in the first trench 120.

The first wire 200 may include a first metal. The first metal may be deposited by using electroless deposition or chemical vapor deposition (CVD). However, example embodiments are not limited to the example given above.

Figure 18:
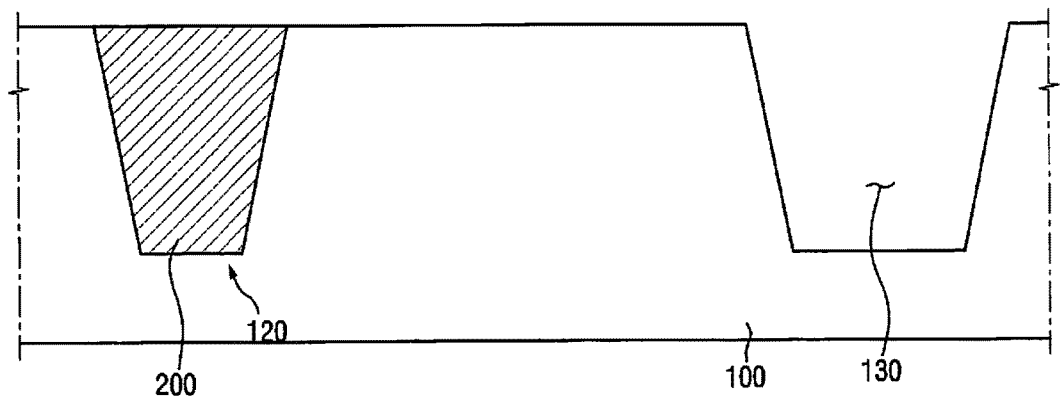

Next, referring to FIG. 18, the filler 400 is removed.

The filler 400 may be substantially entirely removed. According to removal of the filler 400, the second trench 130 may be substantially entirely exposed.

Figure 19:
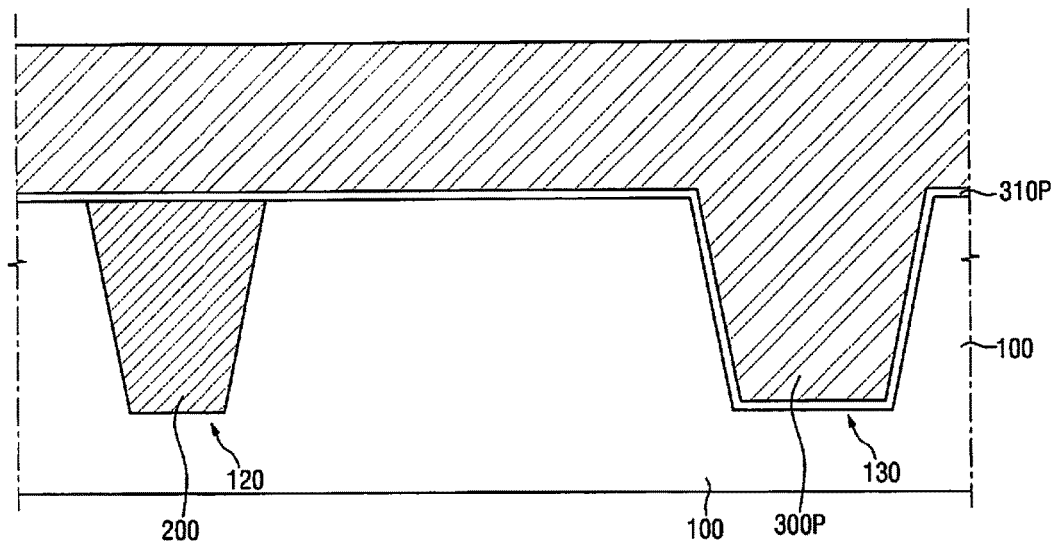

Next, referring to FIG. 19, a pre-barrier metal film 310p is formed.

The pre-barrier metal film 310p is formed conformally along the bottom surface and the side surface of the second trench 130. Furthermore, the pre-barrier metal film 310p may be formed conformally along the upper surface of the first interlayer insulating film 100 and the upper surface of the first wire 200. The pre-barrier metal film 310p may be later formed into the first barrier metal film 310.

Next, a pre-second wire 300P is formed on the pre-barrier metal film 310p.

The pre-second wire 300P may substantially entirely fill the second trench 130. The pre-second wire 300P may be so formed as to fill and exceed the second trench 130.

The pre-second wire 300P may include a second metal. The pre-second wire 300P may include Cu, for example. The pre-second wire 300P may be formed by Cu seeding, Cu reflowing, direct plating, electro-plating, and so on, on the first barrier metal film 310, the liner metal film 350, and so on. However, example embodiments are not limited to the example given above.

Figure 20:
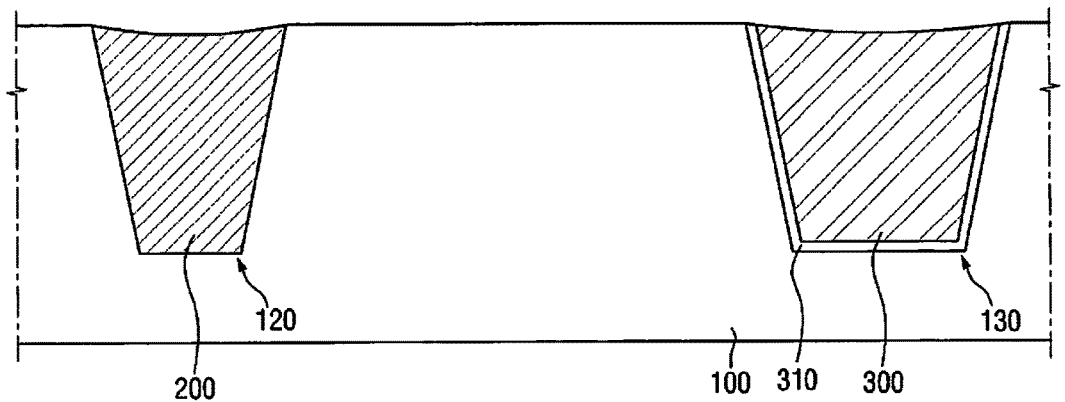

Next, referring to FIG. 20, the upper surfaces of the first wire 200, the second wire 300, the first barrier metal film 310 and the first interlayer insulating film 100 may be planarized. In this case, the upper surfaces of the first wire 200, the second wire 300, the first barrier metal film 310 and the first interlayer insulating film 100 may be substantially the same.

Alternatively, as illustrated, the upper surfaces of the first wire 200 and the second wire 300 may have a bowl shape in which the upper surfaces are curved in. When the planarization process is applied to the first wire 200, the second wire 300, and the first interlayer insulating film 100 simultaneously or contemporaneously, due to difference in the etch tolerance of the materials of the first wire 200, the second wire 300, and the first interlayer insulating film 100, each may have different degree of etching. In this case, the first wire 200 and the second wire 300, having relatively weak etch tolerances, may be etched more than the first interlayer insulating film 100. Due to characteristics of the planarization process, the degree of etching may increase as a distance from an interface between the first wire 200 and the second wire 300, and the first interlayer insulating film 100 becomes greater. Accordingly, the bowl shape as illustrated may appear. However, example embodiments are not limited to the example given above.

Hereinbelow, a method of fabricating a semiconductor device according to an example embodiment will be described with reference to FIGS. 5, 15, 16 and 21 to 24. Elements or operations overlapping with those described above with reference to the semiconductor device and the method of fabricating the same of FIGS. 1 to 20 will be mentioned as briefly as possible or omitted for the sake of brevity.

FIGS. 21 to 24 are views illustrating intermediate stages of fabrication, illustrating a method of fabricating a semiconductor device according to another example embodiment.

An example embodiment will be described with reference to FIG. 21, while omitting the steps of FIGS. 15 and 16 as these are substantially the same as the example embodiment described above.

Figure 21:
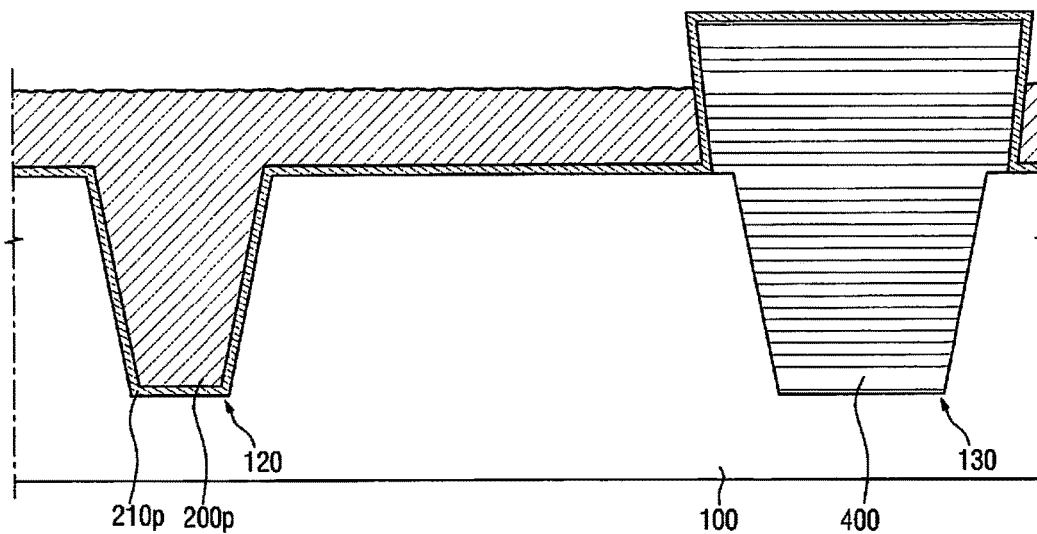
FIGS. 21 to 24 are views illustrating intermediate stages of fabrication and illustrating a method of fabricating a semiconductor device, according to another example embodiment.

Referring to FIG. 21, a pre-first adhesion layer 210P is formed.

The pre-first adhesion layer 210P may be formed conformally along the bottom surface and the side surface of the first trench 120. Furthermore, the pre-first adhesion layer 210P may be formed along the upper surface of the first interlayer insulating film 100, and the exposed side surface and upper surface of the filler 400. The pre-first adhesion layer 210P may be formed later into the first adhesion layer 210.

Next, a pre-first wire 200P is formed on the pre-first adhesion layer 210P. The pre-first wire 200P may include a first metal. The pre-first wire 200P may be formed by electroless deposition, CVD, and/or reflowing. However, example embodiments are not limited to the example given above.

The pre-first wire 200P may substantially entirely fill the first trench 120. Furthermore, the pre-first wire 200P may be so formed as to fill and exceed the first trench 120.

Figure 22:
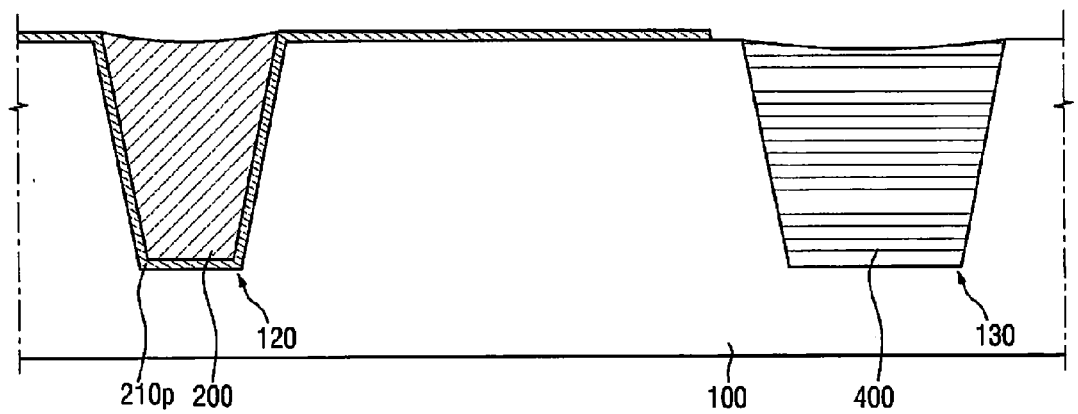

Next, referring to FIG. 22, the pre-first wire 200P, the pre-first adhesion layer 210P, and the filler 400 are planarized.

First, the pre-first adhesion layer 210P and the filler 400 may be etched back. At this time, a portion of the first adhesion layer 210 may be removed. Next, the pre-first wire 200P, the pre-first adhesion layer 210P and the filler 400 are planarized.

Accordingly, the pre-first wire 200P may be formed into the first wire 200. The upper surface of the first wire 200, the upper surface of the filler 400, and the upper surface of the pre-first adhesion layer 210P may all be the same. Note that, due to etch tolerances, the upper surface of the first wire 200 and the upper surface of the filler 400 may have a bowl shape.

Figure 23:
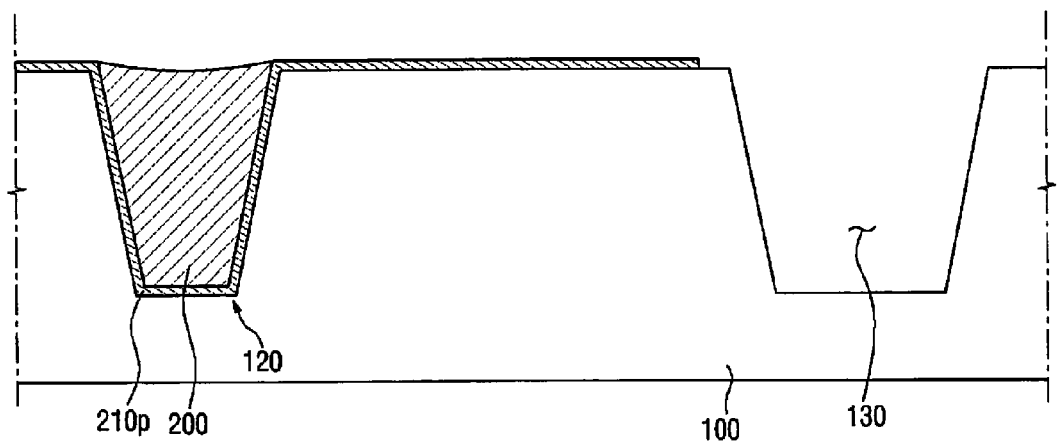

Next, referring to FIG. 23, the filler 400 is removed.

The filler 400 may be removed by, for example, lift off process. The filler 400 may be substantially entirely removed from the second trench 130. According to removal of the filler 400, the second trench 130 may be substantially entirely exposed.

Figure 24:
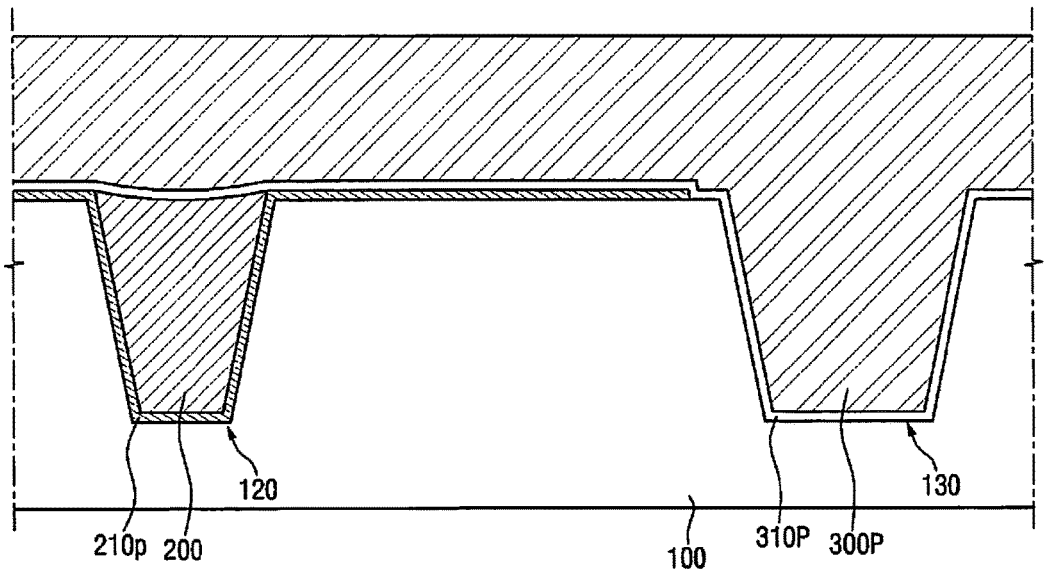

Next, referring to FIG. 24, the pre-barrier metal film 310p is formed.

The pre-barrier metal film 310p is formed conformally along the bottom surface and the side surface of the second trench 130. Furthermore, the pre-barrier metal film 310p may be formed conformally along the upper surface of the first interlayer insulating film 100, the upper surface of the pre-first adhesion layer 210P, and the upper surface of the first wire 200. The pre-barrier metal film 310p may be later formed into the first barrier metal film 310.

Next, a pre-second wire 300P is formed on the pre-barrier metal film 310p.

The pre-second wire 300P may substantially entirely fill the second trench 130. The pre-second wire 300P may be so formed as to fill and exceed the second trench 130.

The pre-second wire 300P may include a second metal. The pre-second wire 300P may include Cu, for example. The pre-second wire 300P may be formed by Cu seeding, Cu reflowing, direct plating, electro-plating, and so on, on the first barrier metal film 310, the liner metal film 350, and so on. However, example embodiments are not limited to the example given above.

Next, referring to FIG. 5, the upper surfaces of the first wire 200, the second wire 300, the pre-first adhesion layer 210P, the first barrier metal film 310 and the first interlayer insulating film 100 may be planarized. At this time, the pre-first adhesion layer 210P may be formed later into the first adhesion layer 210. Further, the upper surfaces of the first wire 200, the second wire 300, the first barrier metal film 310, the first adhesion layer 210, and the first interlayer insulating film 100 may be the same.

Hereinbelow, a method of fabricating a semiconductor device according to an example embodiment will be explained with reference to FIGS. 6, 15, 25, and 26. Elements or operations overlapping with those described above with reference to the semiconductor device and the method of fabricating the same of FIGS. 1 to 24 will be mentioned or omitted for the sake of brevity.

Figure 25:
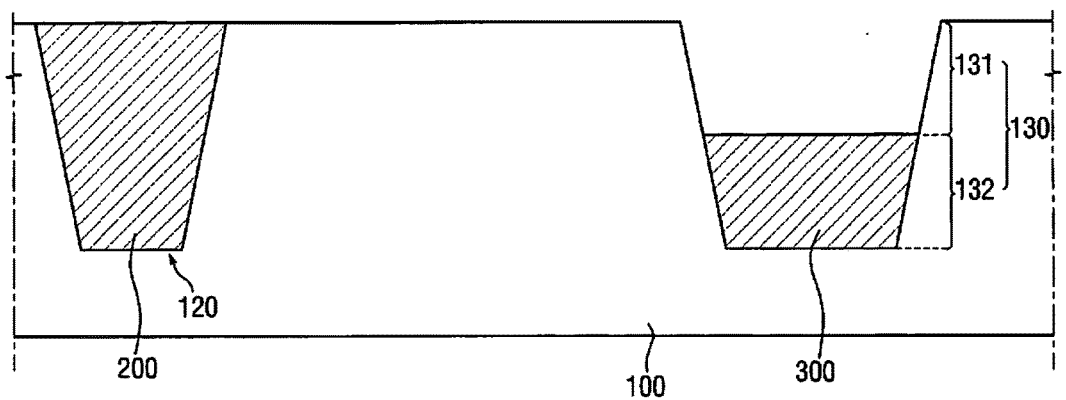
FIGS. 25 and 26 are views illustrating intermediate stages of fabrication and illustrating a method of fabricating a semiconductor device, according to another example embodiment.
Figure 26:
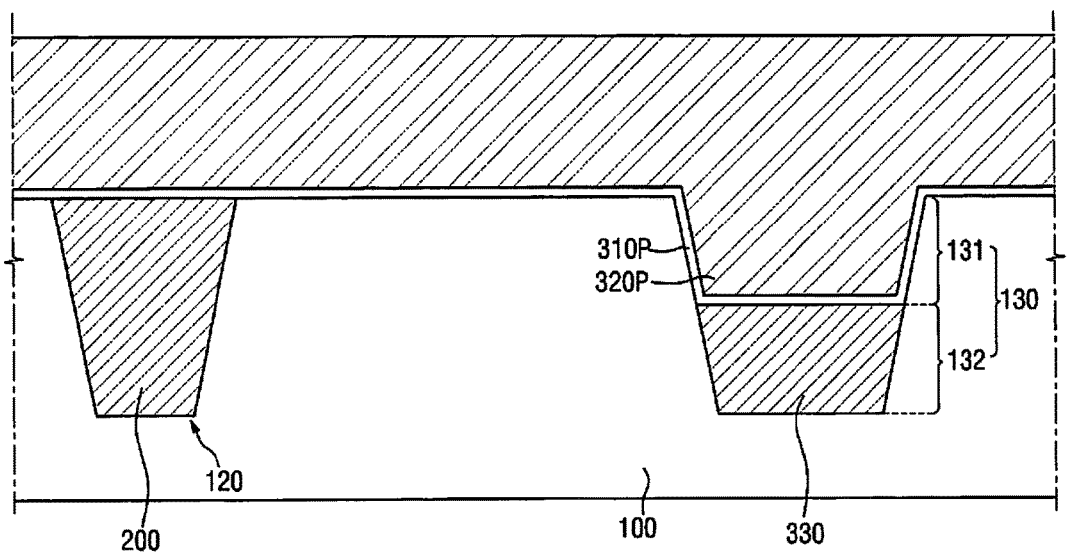

FIGS. 25 and 26 are views illustrating intermediate stages of fabrication, illustrating a method of fabricating a semiconductor device according to another example embodiment.

An example embodiment will be described with reference to FIG. 25, while omitting the steps of FIG. 15 as these are substantially the same as the embodiment described above.

Referring first to FIG. 25, the first wire 200 and the lower wire 330 are formed.

The first wire 200 and the lower wire 330 may include a first metal. The first wire 200 may be formed in the first trench 120, and the lower wire 330 may be formed in the lower portion 132 of the second trench 130. The width of the first trench 120 and the width of the second trench 130 may be different from each other. That is, the width of the second trench 130 may be greater than the width of the first trench 120.

The first wire 200 and the lower wire 330 may be formed by a reflow process. By the reflow process, the heights of the upper surfaces of the first wire 200 and the lower wire 330 may be different from each other according to the width difference of the first trench 120 and the second trench 130. Specifically, the upper surface of the first wire 200 formed in the relatively narrow first trench 120 may be higher than the upper surface of the lower wire 330 formed in the relatively wide second trench 130. That is, when the first wire 200 is formed to substantially entirely fill the first trench 120, the lower wire 330 may be correspondingly formed so that the lower wire 330 may be formed to fill only a portion (i.e., lower portion 132) of the second trench 130.

Next, referring to FIG. 26, the pre-barrier metal film 310p is formed.

The pre-barrier metal film 310p is formed conformally along the side surface of the upper portion 131 of the second trench 130 and the upper surface of the lower wire 330. Furthermore, the pre-barrier metal film 310p may be formed conformally along the upper surface of the first interlayer insulating film 100 and the upper surface of the first wire 200. The pre-barrier metal film 310p may be later formed into the first barrier metal film 310.

Next, a pre-upper wire 320P is formed on the pre-barrier metal film 310p.

The pre-upper wire 320P may substantially entirely fill the second trench 130. The pre-upper wire 320P may be so formed as to fill and exceed the second trench 130.

The pre-upper wire 320P may include a second metal. The pre-second wire 300P may include Cu, for example. The pre-upper wire 320P may be formed by Cu seeding, Cu reflowing, direct plating on the pre-barrier metal film 310p, electro-plating and so on. However, example embodiments are not limited to the example given above.

Next, referring to FIG. 6, the upper surfaces of the first wire 200, the pre-upper wire 320P, the pre-barrier metal film 310p and the first interlayer insulating film 100 may be planarized. At this time, the pre-upper wire 320P may be formed into the upper wire 320, and the pre-barrier metal film 310p may be formed into the first barrier metal film 310.

Alternatively, as illustrated, the upper surfaces of the first wire 200 and the upper wire 320 may have a bowl shape in which the upper surfaces are curved in. When the planarization process is applied to the first wire 200, the upper wire 320, and the first interlayer insulating film 100 simultaneously or contemporaneously, due to difference in the etch tolerance of the materials of the first wire 200, the upper wire 320, and the first interlayer insulating film 100, each may have different degree of etching. In this case, the first wire 200 and the upper wire 320, having relatively weak etch tolerances, may be etched more than the first interlayer insulating film 100. Due to characteristics of the planarization process, the degree of etching may increase as a distance from an interface between the first wire 200 and the upper wire 320, and the first interlayer insulating film 100 becomes greater. Accordingly, the bowl shape as illustrated may appear. However, example embodiments are not limited to the example given above.

Hereinbelow, a method for fabricating a semiconductor device according to an example embodiment will be explained with reference to FIGS. 13 and 27 to 29. Elements or operations overlapping with those described above with reference to the semiconductor device and the method of fabricating the same of FIGS. 1 to 26 will be mentioned or omitted for the sake of brevity.

Figure 27:
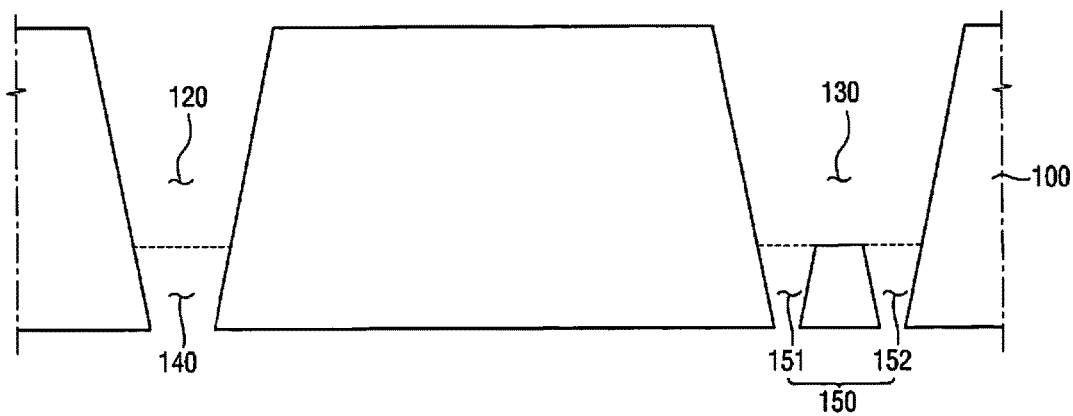
FIGS. 27 to 29 are views illustrating intermediate stages of fabrication and illustrating a method for fabricating a semiconductor device, according to another example embodiment.
Figure 28:
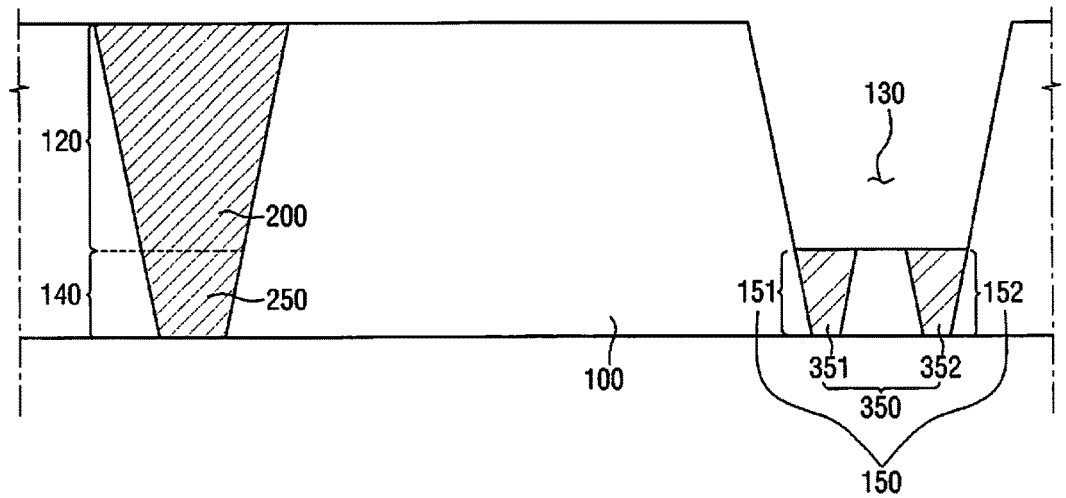
Figure 29:
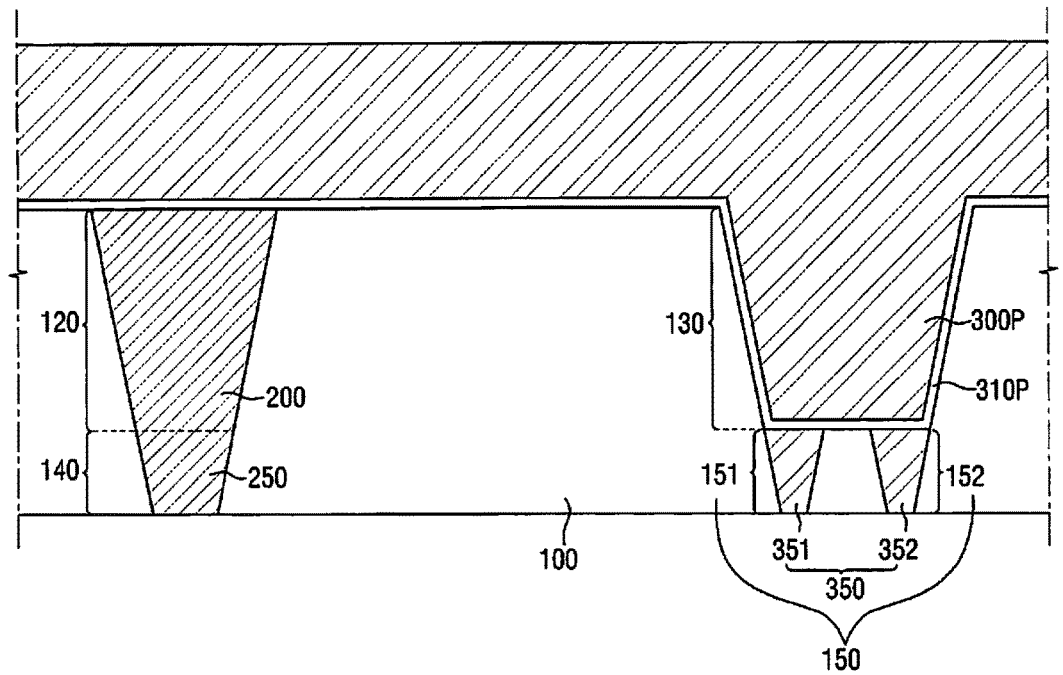

FIGS. 27 to 29 are views illustrating intermediate stages of fabrication, illustrating a method for fabricating a semiconductor device according to another example embodiment.

Referring to FIG. 27, the first interlayer insulating film 100 is formed, and the first trench 120, the second trench 130, the first via 140 and the second via 150 are formed.

The first trench 120, the second trench 130, the first via 140 and the second via 150 may be formed by etching the first interlayer insulating film 100. The width of the first trench 120 may be smaller than the width of the second trench 130. The width of the first trench 120 may be smaller than the reference line width described above with reference to FIG. 3. The width of the second trench 130 may be greater than the reference line width.

The first via 140 and the second via 150 may be formed by passing through the first interlayer insulating film 100. That is, the first via 140 and the second via 150 may be respectively connected to the lower portions of the first trench 120 and the second trench 130, thus connecting the upper surface and the lower surface of the first interlayer insulating film 100.

A plurality of second vias 150 may be provided. The second via 150 may include a first sub-via 151 and a second sub-via 152. While two vias are illustrated in the drawings, the number of the second vias 150 is not limited herein. The width of the second via 150 may be smaller than the width of the second trench 130. The second via 150 and the second trench 130 may have many-to-one relationship. That is, a plurality of second vias 150 may be formed for one second trench 130.

Next, referring to FIG. 28, the first wire 200, the first contact 250 and the second contact 350 are formed.

The first wire 200, the first contact 250 and the second contact 350 may include the first metal. The first wire 200 and the first contact 250 may substantially entirely fill the first trench 120 and the first via 140, respectively. The second contact 350 may substantially entirely fill the second via 150.

A plurality of second contact 350 may be provided. The second contact 350 may include a first sub-contact 351 and a second sub-contact 352. While two contacts are illustrated in the drawings, the number of the second contacts 350 is not limited herein.

Next, referring to FIG. 29, the pre-barrier metal film 310*p* is formed conformally along the bottom surface and the side surface of the second trench 130. That is, the pre-barrier metal film 310*p* may be formed along the upper surface of the second via 150. Furthermore, the pre-barrier metal film 310*p* may be formed conformally along the upper surface of the first interlayer insulating film 100 and the upper surface of the first wire 200. The pre-barrier metal film 310*p* may be later formed into the first barrier metal film 310.

Next, a pre-second wire 300P is formed on the pre-barrier metal film 310*p*.

The pre-second wire 300P may substantially entirely fill the second trench 130. The pre-second wire 300P may be so formed as to fill and exceed the second trench 130.

The pre-second wire 300P may include a second metal. The pre-second wire 300P may include Cu, for example. The pre-second wire 300P may be formed by Cu seeding, Cu reflowing, direct plating, electro-plating, and so on, on the first barrier metal film 310, the liner metal film 350, and so on. However, example embodiments are not limited to the example given above.

Next, referring to FIG. 13 the upper surfaces of the first wire 200, the second wire 300, the first barrier metal film 310 and the first interlayer insulating film 100 may be planarized. In this case, the upper surfaces of the first wire 200, the second wire 300, the first barrier metal film 310 and the first interlayer insulating film 100 may be same.

Alternatively, as illustrated, the upper surfaces of the first wire 200 and the second wire 300 may have a bowl shape in which the upper surfaces are curved in. When the planarization process is applied to the first wire 200, the second wire 300, and the first interlayer insulating film 100 simultaneously or contemporaneously, due to difference in the etch tolerance of the materials of the first wire 200, the second wire 300, and the first interlayer insulating film 100, each may have different degree of etching. In this case, the first wire 200 and the second wire 300, having relatively weak etch tolerances, may be etched more than the first interlayer insulating film 100. Due to characteristics of the planarization process, the degree of etching may increase as a distance from an interface between the first wire 200 and the second wire 300, and the first interlayer insulating film 100 becomes greater. Accordingly, the bowl shape as illustrated may appear. However, example embodiments are not limited to the example given above.

While the inventive concepts have been particularly shown and described with reference to example embodiments thereof, it will be understood by those of ordinary skill in the art that various changes in form and details may be made therein without departing from the spirit and scope of the inventive concepts as defined by the following claims. It is therefore desired that the example embodiments be considered in all respects as illustrative and not restrictive, reference being made to the appended claims rather than the foregoing description to indicate the scope of the invention.

What is claimed is:

1. A semiconductor device, comprising:
    an interlayer insulating film including a first trench having a first line width and a second trench having a second line width, the first line width and the second line width being different;
    a first wire substantially filling the first trench and including a first metal; and
    a second wire substantially filling the second trench and including a second metal different from the first metal,
    a sidewall of a lower portion of the second trench being coplanar with a sidewall of an upper portion of the second trench.

2. The semiconductor device of claim 1, wherein:
    the first line width is smaller than a reference line width; and
    the second line width is greater than the reference line width.

3. The semiconductor device of claim 1, further comprising:
a barrier metal film between the second wire and the interlayer insulating film.

4. The semiconductor device of claim 1, further comprising:
a first adhesion layer between the interlayer insulating film and the first wire.

5. The semiconductor device of claim 1, wherein the first line width is less than the second line width.

6. A semiconductor device, comprising:
an interlayer insulating film;
a first wire in a first trench within the interlayer insulating film, the first wire having a first line width and including a first metal;
a second wire in a second trench within the interlayer insulating film, the second wire having a second line width greater than the first line width, the second wire having a height substantially same as a height of the first wire, and the second wire including a second metal different from the first metal; and
a barrier metal between the second wire and the interlayer insulating film;
a sidewall of a lower portion of the second trench being coplanar with a sidewall of an upper portion of the second trench.

7. The semiconductor device of claim 6, further comprising:
a first contact connected to a lower portion of the first wire and passing through the interlayer insulating film.

8. The semiconductor device of claim 6, further comprising:
a second contact connected to a lower portion of the second wire and passing through the interlayer insulating film.

9. The semiconductor device of claim 6, wherein the second wire comprises:
a lower wire including the first metal; and
an upper wire including the second metal on the lower wire.

10. A semiconductor device, comprising:
an interlayer insulating film including a first trench having a first line width, and
a second trench having a second line width, the second trench including an upper portion and a lower portion, the second line width being greater than the first line width;
a first wire substantially filling the first trench and including a first metal; and
a second wire substantially filling the second trench and including a lower wire and an upper wire,
the lower wire substantially filling a lower portion of the second trench and including the first metal, and
the upper wire substantially filling an upper portion of the second trench and including a second metal different from the first metal,
a sidewall of the lower portion of the second trench being coplanar with a sidewall of the upper portion of the second trench.

11. The semiconductor device of claim 10, wherein the second trench comprises a second via at a bottom surface of the second trench, the second via being through the interlayer insulating film.

12. The semiconductor device of claim 10, wherein the first metal comprises at least one of Co, Ru or a Co—Ru solid solution.

13. The semiconductor device of claim 10, wherein the second metal comprises Cu.

14. The semiconductor device of claim 10, further comprising:
a first adhesion layer between the first wire and the interlayer insulating film.

15. The semiconductor device of claim 14, further comprising:
a second adhesion layer between the second wire and the interlayer insulating film.

16. The semiconductor device of claim 14, wherein the first adhesion layer comprises TiN.

17. The semiconductor device of claim 10, further comprising:
a barrier metal film between the upper wire and the interlayer insulating film.

18. The semiconductor device of claim 17, further comprising:
a liner metal film between the upper wire and the barrier metal film.

19. The semiconductor device of claim 17, wherein the barrier metal film extends between the upper wire and the lower wire.

20. The semiconductor device of claim 17, wherein the barrier metal film comprises at least one of TaN or MnN.

* * * * *